United States Patent
Kononchuk et al.

(10) Patent No.: US 6,669,775 B2
(45) Date of Patent: *Dec. 30, 2003

(54) HIGH RESISTIVITY SILICON WAFER PRODUCED BY A CONTROLLED PULL RATE CZOCHRALSKI METHOD

(75) Inventors: Oleg V. Kononchuk, Brush Prairie, WA (US); Sergei V. Koveshnikov, Vancouver, WA (US); Zbigniew J. Radzimski, Brush Prairie, WA (US); Neil A. Weaver, Battle Ground, WA (US)

(73) Assignee: SEH America, Inc., Vancouver, WA (US)

( * ) Notice: Subject to any disclaimer, the term of this patent is extended or adjusted under 35 U.S.C. 154(b) by 112 days.

This patent is subject to a terminal disclaimer.

(21) Appl. No.: 10/008,403

(22) Filed: Dec. 6, 2001

(65) Prior Publication Data

US 2003/0106481 A1 Jun. 12, 2003

(51) Int. Cl.[7] ............................................... C20B 15/20
(52) U.S. Cl. .............................. 117/13; 117/14; 117/36; 117/37; 117/84; 117/89; 117/92
(58) Field of Search ............................... 117/13, 14, 36, 117/37, 84, 89, 92

(56) References Cited

U.S. PATENT DOCUMENTS

| | | |
|---|---|---|
| 5,744,380 A | 4/1998 | Uemura et al. |
| 5,779,791 A | 7/1998 | Korb et al. |
| 5,919,302 A | 7/1999 | Falster et al. |
| 6,120,598 A | 9/2000 | Iida et al. |
| 6,120,749 A | 9/2000 | Takano et al. |
| 6,190,631 B1 | 2/2001 | Falster et al. |
| 6,197,109 B1 | 3/2001 | Iida et al. |

FOREIGN PATENT DOCUMENTS

EP  1 087 041 A1  3/2001

Primary Examiner—Felisa Hiteshew
(74) Attorney, Agent, or Firm—Alston & Bird LLP

(57) ABSTRACT

A method of obtaining a wafer exhibiting high resistivity and high gettering effect while preventing the reduction of resistivity due to the generation of oxygen donors, and while further minimizing in-grown defects is provided by: a) using the CZ method to grow a silicon single crystal ingot having a resistivity of 100 Ω·cm or more, preferably 1000 Ω·cm, and an initial interstitial oxygen concentration of 10 to 40 ppma with a v/G ratio of from about $1\times10^{-5}$ cm$^2$/s·K to about $5\times10^{-5}$ cm$^2$/s·K, b) processing the ingot into a wafer, and c) subjecting the wafer to an oxygen precipitation heat treatment whereby the residual interstitial oxygen content in the wafer is reduced to about 8 ppma or less.

16 Claims, 1 Drawing Sheet

HIGH RESISTIVITY SILICON WAFER PRODUCED BY A CONTROLLED PULL RATE CZOCHRALSKI METHOD

FIELD OF THE INVENTION

The present invention relates to a method of producing a high-resistivity silicon wafer. More particularly, the present invention relates to a method of producing a high-resistivity silicon wafer which exhibits minimal change in resistivity upon heat treatment during device processing and which has reduced density and reduced size of defects.

BACKGROUND OF THE INVENTION

High resistivity silicon wafers have conventionally been used for power devices such as high-voltage power devices and thyristors. More recently, C-MOS devices, Schottky barrier diodes, and other semiconductor devices for use in mobile communications have been developed which require the use of high-resistivity silicon wafers. The high-resistivity wafers tend to decrease the effects of parasitic capacitance among the devices of the wafer, allowing the devices to be more closely packed upon the surface of the wafer while, at the same time, reducing signal transmission loss among the devices.

High-resistivity wafers are generally defined as those silicon wafers with resistivity of 100 Ω·cm or greater, and typically have resistivity of 1000 Ω·cm or greater. The initial resistivity of a wafer is established during crystal growth by the precise addition of dopants to the molten polysilicon from which the silicon crystal is formed. By doping, the resistivity of the crystals can be controlled within close tolerances. However, the initial resistivity may be altered, desirably or undesirably, during subsequent processing of the wafer such that the final resistivity of the wafer may be very different from the resistivity directly after crystal growth.

In order to form more devices from a single wafer and therefore reduce the cost per device, larger wafers are generally preferred. As such, while high resistivity silicon wafers may be fabricated by a float zone technique, the limitations on size of the resulting wafers make the Czochralski (CZ) crystal growing method the desired fabrication technique. The CZ method allows wafers having diameters of 200 mm, 300 mm, 400 mm, or larger to be produced. In addition to the large wafer diameter, the CZ method also provides wafers with excellent planar resistivity distribution. Good planar resistivity distribution means that the wafer has only minimal variations in resistivity along the plane which was perpendicular to the direction of pull of the crystal during crystal growth.

Unfortunately, there are some problems related to the presence of oxygen during the growth of high-resistivity silicon wafers in a CZ apparatus. During crystal growth within a CZ apparatus, oxygen from the quartz crucible tends to be introduced into the silicon crystal and is maintained in the interstitial spaces of the silicon crystal lattice. The interstitial oxygen atoms are normally electrically neutral, but the oxygen atoms tend to agglomerate as oxygen-containing thermal donors (OTDs), which become electron donors when subjected to heat in the range of 350° C. to 500° C. Thus, the resistivity of the wafer may be unfavorably decreased by a relatively mild heating due to the contribution of electrons from the OTDs residing in the wafer. The decrease in resistivity due to the oxygen is especially problematic considering that temperatures in the range of 350° C. to 500° C. are commonly encountered during process steps subsequent to wafer fabrication, such as during device fabrication.

The elimination of oxygen from the silicon lattice is not a complete solution to the problem of resistivity variation within a silicon wafer. The presence of oxygen within the silicon crystal causes bulk defects to form within the crystal. Though large numbers of bulk defects are not desired, small numbers of bulk defects contribute to a gettering effect within the crystal. By gettering, the defects within the crystal act to trap mobile ionic contamination and to prevent the contamination from traveling to the surface of the wafer. The gettering is necessary to protect the devices on the surface of the wafer from interference from the contaminants. Thus, some oxygen within the wafer is desirable, although too much oxygen is disadvantageous and tends to decrease the resistivity of the silicon wafer.

Further to the concerns of oxygen being present within the wafer, the grown crystal is also likely to contain grown-in defects such as Flow Pattern Defects (FPD), Laser Scattering Tomography Defects (LSTD), Crystal Originated Particles (COP), Large Secco Etch Pit Defects (LSEPD), and Large Flow Pattern Defects (LFPD). It is considered very important to reduce the density and the size of the defects.

Generally speaking, there are two predominant types of defects within the growing crystal, a void type point defect called vacancy, abbreviated as V, and an interstitial type silicon point defect called interstitial silicon, abbreviated as I.

A V region in a silicon single crystal is a region containing many vacancies, such as depressions, pits, voids, and similar defects generated due to missing silicon atoms. V region defects include FPD, LSTD, and COP defects. An I region is a region containing many dislocation and aggregations of excessive silicon atoms generated due to excessive amounts of silicon atoms within the lattice. I region defects include LSEPD and LFPD defects. Between V regions and I regions, there exist neutral regions, abbreviated as N, which have no vacancies or interstitial silicon.

When the pull rate of the crystal is relatively high, a V region is found across the entire radial cross-section of the growing crystal. When the pull rate is decreased, a ring called the OSF, or Oxidation Induced Staking Fault ring, forms at the circumference of the growing crystal. As the rate of crystal pull is reduced, the OSF moves from the radial circumference of the growing crystal ingot toward the center, with the portion of the crystal laying between the OSF and the outer circumference of the crystal being an I region. At low pull rates, the OSF approaches the center of the cross-section of the growing crystal and eventually disappears, leaving the entire cross-section of the growing crystal as an I region.

It has been discovered that a region called the neutral region, or N region contains neither vacancy type defects nor interstitial type defects. The N region is present between the V region and the I region, outside of the OSF ring. The size and the orientation of the N region varies with the parameter of v/G, which is the ratio of the pulling rate of the crystal, v, and the crystal solid-liquid interface temperature gradient, G, along the growing axis.

Through variation of the pulling rate and/or temperature gradient, the v/G ratio may be optimized to produce a crystal having the N region spreading over the entire transverse cross-section of the crystal, for example, when the crystal is pulled with a gradually decreasing pulling rate, v. An N region which spreads over the entire transverse cross-section does not contain grown-in defects at all.

What is needed is a method of producing high-resistivity silicon wafers having a reduced interstitial oxygen content, having sufficient precipitated oxygen to provide effective gettering within the body of the wafer, and having low in-grown defect content.

SUMMARY OF THE INVENTION

The invention is a method of treating a high-resistivity silicon wafer containing interstitial oxygen in such a way that the oxygen is largely precipitated, which prevents the oxygen from acting as an electron donor and prevents the resistivity of the wafer from diminishing. The method simultaneously minimizes the density and size of in-grown defects within the high-resistivity silicon wafer.

A method of obtaining a wafer exhibiting high resistivity and high gettering effect while preventing the reduction of resistivity due to the generation of oxygen thermal donors, and while further minimizing in-grown defects is provided by: a) using a CZ method to grow a silicon single crystal ingot having a resistivity of 100 Ω·cm or more and an initial interstitial oxygen concentration of 10 to 40 ppma with a v/G ratio from about $1 \times 10^{-5}$ cm$^2$/s·K to about $5 \times 10^{-5}$ cm$^2$/s·K, b) processing the ingot into a wafer, and c) subjecting the wafer to an oxygen precipitation heat treatment whereby the residual interstitial oxygen content in the wafer is reduced to about 7 ppma or less.

The resulting wafer has high resistivity, increased gettering ability, and is resistant to slip dislocations. Further, the wafer contains no grown-in defects. Precipitation of the interstitial oxygen content prevents the oxygen constituents from becoming electrically active thermal donors upon subsequent heat treatments of the silicon wafer, such as during device installation. Thus, a consistent wafer resistivity may be maintained without undue change caused by undesirable electron donation from oxygen content within the wafer.

BRIEF DESCRIPTION OF THE DRAWINGS

Figure 1:
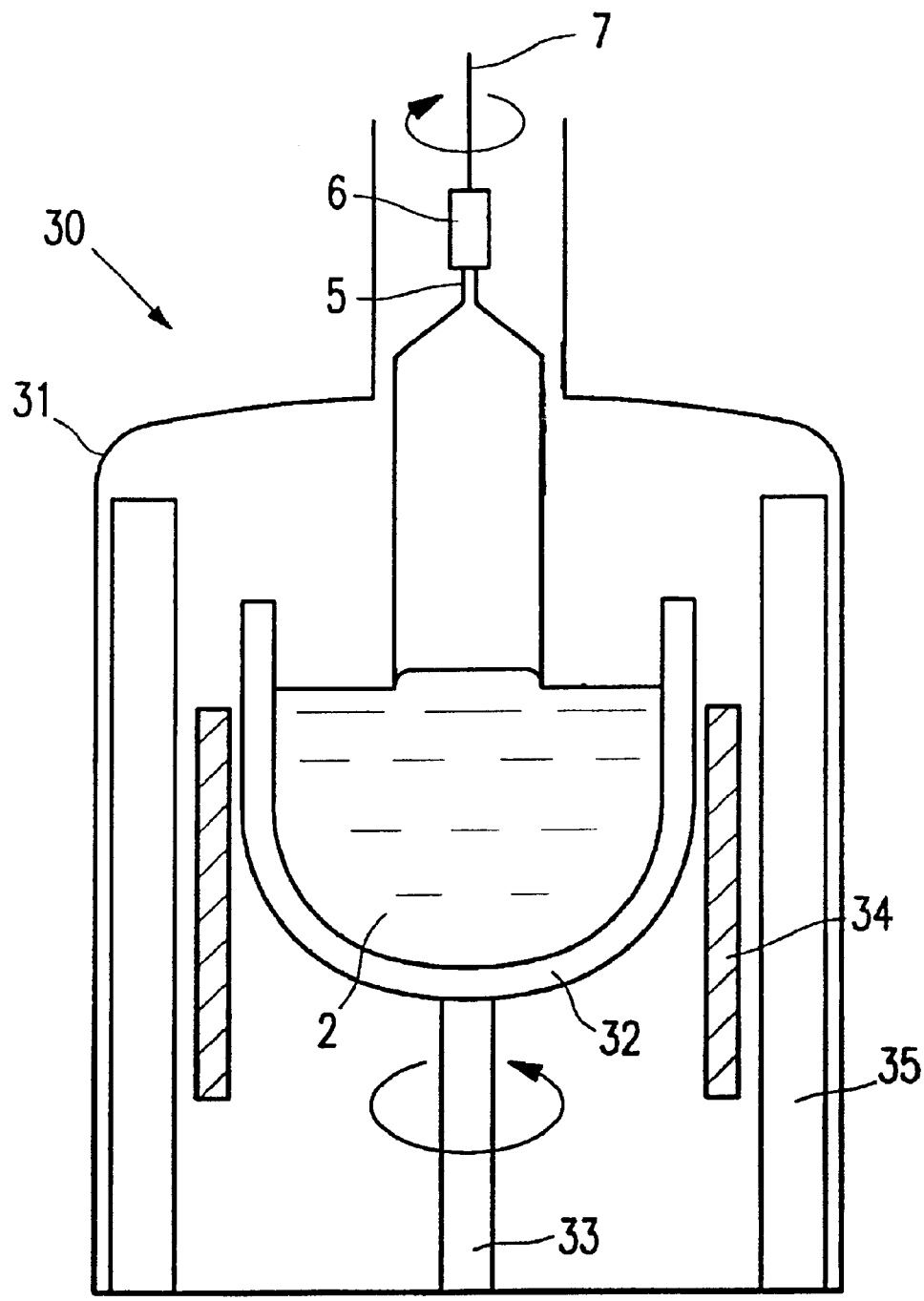

Having thus described the invention in general terms, reference will now be made to the accompanying drawing, which is not necessarily drawn to scale, and wherein:

FIG. 1 illustrates an exemplary Czochralski crystal growing apparatus.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

A method of obtaining a wafer exhibiting high resistivity and high gettering effect while preventing the reduction of resistivity due to the generation of oxygen thermal donors, and while further minimizing in-grown defects is provided by: a) using the CZ method to grow a silicon single crystal ingot having a resistivity of 100 Ω·cm or more and an initial interstitial oxygen concentration of 10 to 40 ppma with a v/G ratio of from about $1 \times 10^{-5}$ cm$^2$/s·K to about $5 \times 10^{-5}$ cm$^2$/s·K, b) processing the ingot into a wafer, and c) subjecting the wafer to an oxygen precipitation heat treatment whereby the residual interstitial oxygen content in the wafer is reduced to about 7 ppma or less, and preferably between about 5 ppma and about 6 ppma.

The resulting wafer has high resistivity, increased gettering ability, and is resistant to slip dislocations. Further, the wafer contains no grown-in defects. Precipitation of the interstitial oxygen content prevents the oxygen constituents from becoming electrically active thermal donors upon subsequent heat treatments of the silicon wafer, such as during device installation. Thus, a consistent wafer resistivity may be maintained without undue change caused by undesirable electron donation from oxygen content within the wafer.

By maintaining considerable amounts of oxide precipitates within the bulk portion of the wafer, the oxide precipitates provide sufficient gettering to prevent contaminants within the bulk portion from moving to the surface portion of the wafer.

By growing the silicon ingots under conditions of a v/G ratio of from about $1 \times 10^{-5}$ cm$^2$/s·K to about $5 \times 10^{-5}$ cm$^2$/s·K, the ingots have an N region which spreads over the entire transverse cross-section of the ingot and contains no grown-in defects, thus the resulting wafers are free of grown-in defects.

a. Growth of the Crystal and b. Slicing the Crystal into Wafers

The general method of growing silicon ingots according to the CZ method and thereafter slicing the ingots into silicon wafers is known in the art. General reference on performing the CZ method is provided by Ullmann's Encyclopedia of Industrial Chemistry, vol. A23, p.727–731 (1993) and further by Van Zant, Peter, Microchip Fabrication, Fourth Edition, p.53–55 (2000).

First, an exemplary structure of the apparatus for pulling a single crystal by the CZ method will be explained by referring to FIG. 1. As shown in FIG. 1, the apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and rotation mechanism therefore (not shown), seed chuck 6 for holding a silicon seed crystal 5, cable 7 for pulling the seed chuck 6, and winding mechanism (not shown) for rotating and winding the cable 7. The speed of the winding mechanism determines the pull rate of the apparatus. The crucible 32 is composed of an inner quartz crucible for accommodating a silicon melt (molten metal) 2, and an outer graphite crucible. Further, insulating material 35 surrounds the outside of the heater 34. Further, a cylindrical cooling apparatus (not shown) for cooling the single crystal by jetting cooling gas, or shielding radiant heat may be provided.

In production of the crystal, a silicon polycrystal material of high purity is melted in the crucible 32 by heating to a temperature higher than the melting point, or about 1420° C. Then, a tip end of the seed crystal 5 is brought into contact with, or immersed into the surface of the melt 2 at its approximate center portion by reeling out the cable 7. Then, the crucible-holding shaft 33 is rotated in an optional direction, and the seed crystal 5 is simultaneously pulled upwardly by winding up the cable 7 with rotating the cable to start the growing of single crystal. Thereafter, a single crystal ingot 1, approximately in a cylindrical shape, can be obtained by controlling the pulling rate and temperature as described below.

The amount of oxygen which enters the crystal in the first place may be controlled somewhat through variations in the rate of rotation of the crucible, the amount and flowrate of gas within the CZ chamber, the pressure of the atmosphere within the CZ chamber, and temperature distribution within the silicon melt.

It is desired that the amount of interstitial oxygen contained within the silicon ingot remain constant along the direction of pull. The main source of oxygen which contributes to the silicon ingot is derived from the quartz crucible which contains the polysilicon melt. Oxygen from the quartz is released into the melt and eventually becomes locked as interstitial particles within the silicon lattice of the crystal. EP 0837159A1 describes a method of controlling oxygen content within a silicon ingot along the direction of pull. The disclosed method may optionally be used to provide for uniform oxygen content within the ingot. The method entails increasing the pressure of the atmosphere above the polysilicon melt as the crystal ingot is pulled, thereby inhibiting the vaporization of silicon oxide from the melt, which increases the amount of oxygen available to the melt and crystal. By gradually increasing the pressure of the atmosphere above the polycrystalline melt during formation of the crystal, a uniform amount of oxygen provided to the growing crystal can be maintained.

In order that in-grown defects may be minimized within the wafer, the value of v/G, or the ratio of pull speed to the temperature gradient which exists at the solid-molten silicon interface, is from about $1 \times 10^{-5}$ cm$^2$/s·K to about $5 \times 10^{-5}$ cm$^2$/s·K. The value of $2.1 \times 10^{-5}$ cm$^2$/s·K is the theoretical value which should provide the optimum defect minimization. However, in practice, v/G values ranging from about 0.5 to about 2.5 times the theoretical value, or from about $1 \times 10^{-5}$ cm$^2$/s·K to about $5 \times 10^{-5}$ $^{cm2}$/s·K, may be used with favorable results. v/G values ranging from about 1.0 to about 2.0 times the theoretical value tend to provide improved defect suppression, while v/G values ranging from about 0.75 to about 1.1 times the theoretical value give still better results.

The average temperature gradient, G, depends predominantly on the design of the crystal puller. G is measured at the interface of the molten silicon with the solid silicon of the wafer. This interface is found in the "hot zone" of the crystal puller. G is inherent in the mechanical arrangement of the crystal puller about the "hot zone", but may be altered by using devices such as reflectors, radiation shields, purge tubes, light pipes, and heaters, to alter the heating characteristics within the puller. It is also possible that the position of the above described devices may be changed while pulling the crystal so that a relatively constant G may be maintained despite changing levels of silicon within the quartz crucible.

Alternatively, if the pull rate of the crystal can not be varied due to other process considerations, G may be varied during the crystal growing process in order to maintain the v/G ratio within the above described ranges. In particular, the pull rate, v, is typically lowered to accommodate the production of large diameter wafers. In such cases, G may need to be varied considerably.

v, the pull rate of the crystal within the CZ chamber, may be varied, and typically is varied, as the crystal is pulled. The pull rate is controlled by the speed of the winding mechanism for cable 7 which supports the suspended crystal within the chamber.

It has been found that defects which are grown in the crystal despite the carefully controlled v/G ratio remain mobile within the crystal until it is cooled. The grown crystal of this invention is optionally cooled in a controlled manner to allow for interstitial defects to mobilize and possibly become neutralized by vacancy defects within the crystal. After solidification of the silicon crystal, cooling rates from about 0.1° C./min to about 3° C./min allow defects to remain mobile and to neutralize one another. More information on defect mobilization, and v/G ratio manipulation in general, is found in U.S. Pat. No. 6,190,631, incorporated herein by reference.

After the completion of crystal growth, the grown crystal ingot is sliced into wafers using techniques commonly available in the art of silicon wafer processing.

c. Heat Treatment

The high-resistivity wafer cut from the grown crystal ingot is heat treated until the residual interstitial oxygen concentration within the wafer becomes 8 ppma or less. The heat treatment reduces the bulk defect density to between $1 \times 10^8$ and $2 \times 10^{10}$ defects/cm$^3$.

The gettering heat treatment may vary considerably, depending on the previous processing of the silicon ingot and wafer, but will generally consist of 3 or 4 heat stages, each of increasing temperature. Each heating stage preferably occurs in an inert atmosphere such as nitrogen or argon.

An exemplary 2 stage heat treatment comprises heating the high resistivity wafer to 800° C. for 4 hours, then heating the wafer at 1000° C. for 16 hours. An exemplary 3 stage heat treatment comprises heating the high resistivity wafer to 650° C. for about 2 hours, heating the wafer at 800° C. for about 4 hours, and heating the wafer at 1000° C. for about 16 hours.

For the mass production of wafers, a batch heat treatment furnace may be used for the heat treatment of the wafers. Use of the furnace allows for the simultaneous heat treatment of several wafers, lowering the required per wafer process time. The heat treatment furnace is capable of maintaining elevated temperatures within a predetermined range and is capable of rapidly increasing and decreasing the temperature within the furnace. The atmosphere within the furnace is also carefully controlled and is typically argon, nitrogen, or other inert or nearly inert gas.

The amount of interstitial oxygen within the silicon crystal, after production of the crystal but prior to any precipitation heat treatment, should be between about 10 ppma and about 40 ppma. A minimum amount of interstitial oxygen is required within the silicon so as to effectively getter impurities. In this regard, 10 ppma is an approximate minimum amount of interstitial oxygen that should be present before heat treating. Conversely, exceedingly high amounts of interstitial oxygen in the crystal lead to excessive precipitation which tends to weaken the structure of the crystal. An approximate upper limit of acceptable interstitial oxygen content is 40 ppma. The maximum interstitial oxygen content typically utilized is about 25 ppma. It is noted that lower or higher amounts of oxygen content may be used, but the resulting wafer would have reduced gettering capacity or increased degradation of physical structure, respectively.

A silicon wafer treated in accordance with the invented method exhibits an interstitial oxygen concentration of 8 ppma or less and an oxide precipitate density of $1 \times 10^8$ to $2 \times 10^{10}$ defects/cm$^3$. Since the unprecipitated interstitial oxygen does not favorably contribute to the gettering ability of the wafer material, the residual interstitial content is preferably below 6 ppma.

In silicon wafer production, favorable qualities associated with high resistivity are typically encountered at resistivities above about 1000 Ω·cm. Therefore, the resistivity of the silicon wafer should be greater than 1000 Ω·cm both before and after the oxygen precipitation heat treatment. Resistivity may certainly be higher than 1000 Ω·cm and may be tailored to the demands imposed by a subsequent device fabrication process.

While the wafers described hereinabove may serve as the substrate for subsequent device fabrication, the oxygen precipitation heat treated wafers may optionally be utilized as base layers, or as both layers, in the production of Silicon On Insulator (SOI) wafers. In SOI production, a thin upper "bond" layer formed of a thin silicon wafer having very few defects is placed atop a "base" layer formed of a thicker silicon wafer. The two layers are fused together with an insulating material, usually a thin layer of oxide film.

When used as a base layer in an SOI wafer, the high resistivity of the oxygen precipitation heat treated wafer reduces signal transmission loss, which is especially useful with high frequency devices. Additionally, the gettering ability of the oxygen precipitation heat treated wafer traps contaminants and prevents the wafer contaminants in the base wafer from transferring into the low defect bond wafer.

Optionally, in production of the SOI wafer, heat treatment required to fuse the bond layer to the base layer with the thin oxide layer may also serve as the final stage in the oxygen precipitation heat treatment of the base layer. In this manner, the oxygen precipitation heat treatment of the base layer may be started before contact of the base layer with the bond layer or the oxide film. Prior to completion of the oxygen precipitation heat treatment, the base layer and bond layer are contacted via the oxide film and subsequent heating acts to simultaneously complete the oxygen precipitation heat treatment and fuse the two silicon wafers together via the oxide film, creating a SOI wafer in less time and with lower power requirements than if the oxygen precipitation heat treatment and SOI bonding heat treatment were not carried out simultaneously. Of course, consecutive heat treatments, though not preferred, are well within the scope of this invention.

When SOI wafers are produced with the simultaneous oxygen precipitation heat treatment and SOI bonding heat treatment steps, the first portion of the oxygen precipitation heat treatment is preferably performed prior to the final polishing of the upper surface of the base wafer. This is because slight alterations in the surface of the base wafer may occur as oxygen and other impurities near the surface of the wafer are off-gassed during heat treatment. Thus, final polishing of the upper surface of the base layer should be accomplished after the initial stages of the oxygen precipitation heat treatment but before mating the base layer with the oxide layer and the bond wafer. While the oxygen precipitation heat treatment is preferably performed prior to the final polishing of the wafer. It should be noted that the oxygen precipitation heat treatment described herein may be successfully utilized at any point in polishing, etching, or deposition process.

Although the precipitated oxygen and interstitial oxygen are desirable within the bulk portion of the wafer due to their gettering ability, oxygen is not desired in the surface portion of the wafer, where the electronic devices of the microchip are installed. To remove oxygen from the surface of the wafer, the wafer is optionally heat treated at about 900° C. or higher, preferably between about 1100° C. and 1250° C., which out-diffuses the interstitial oxygen from the surface of the wafer and creates a denuded zone (DZ layer). The denuding heat treatment also out-diffuses any nitrogen residing near the surface of the wafer.

The denuding heat treatment need only be maintained for a short period of time relative to the heat treatment required for the oxygen precipitation heat treatment. Upon a denuding heat treatment, oxygen is out-diffused from the surface of the wafer. The out-diffusion results in an oxygen gradient within the surface of the wafer, with oxygen content increasing with depth. The longer the wafer is subjected to denuding heat treatment, the deeper the resulting denuded zone will extend within the wafer.

At a temperature of 1150° C., a wafer should be heat treated for approximately 30 minutes to provide a 10 $\mu$m thick DZ layer with an oxygen concentration of 1 ppma or less at the wafer surface. Heat treatment for approximately 2 hours provides a 20 $\mu$m thick DZ layer with an oxygen concentration of 1 ppma or less at the wafer surface. The denuding heat treatment preferably occurs in a hydrogen or other inert atmosphere. Alos, the denuding heat treatment should occur at the beginning of the heat treating process, and begins the precipitation of oxygen within the wafer.

An epitaxial layer may optionally be deposited upon a surface of the high resistivity wafer prior to device fabrication. In the case of epitaxial deposition, the surface of the wafer should be heat treated as described above before deposition of the epitaxial layer. Deposition of the epitaxial layer provides an overall wafer having a high resistivity, a defect free surface, and a bulk portion with low interstitial oxygen content and improved gettering ability.

After treatment in accordance with this invention, any subsequent heat treatment of the silicon wafer between about 350° C. and 500° C. will result in negligible change in resistivity of the wafer. This temperature range is important, because it is a common range of temperatures experienced during device production heat treatment, collectively referring to the various heat treatments used in the device production process, such as electrode wiring. By eliminating resistivity change subsequent to wafer fabrication, microchip producers can easily predict the resistivity of the wafer after device fabrication. In wafers of the prior art, resistivity of the silicon wafer would change with each device production heat treatment step, making final resistivity difficult to predict and similarly making device performance somewhat hard to predict.

Another benefit gained from subjecting the wafer obtained from a silicon single crystal ingot having an initial interstitial oxygen concentration of 10 to 40 ppma to an oxygen precipitation heat treatment so that a residual interstitial oxygen concentration in the wafer should become 8 ppma or less, and preferably 6 ppma or less as described above, is that oxide precipitates and residual interstitial formed in the bulk portion of the wafer act to suppress slip dislocations. The tendency to suppress slip dislocations is surprising, given the fact that oxide precipitation within a wafer typically promotes slip dislocations.

The resistance to slip dislocations enables the wafer to be mechanically handled during heat treatment without defects developing within the wafer due to mechanical stresses upon the wafer. The practical effect of the slip dislocation suppression is that the wafers may be handled in heat treatment boats or other heat treatment equipment without imparting defects to the wafer.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for producing a silicon wafer which retains high-resistivity throughout a device fabrication heat treatment, comprising:

growing a silicon single crystal ingot having a resistivity of 100 Ω·cm or greater and an initial interstitial oxygen concentration of about 10 to about 40 ppma by the Czochralski method with a ratio of pull rate (v) to axial temperature gradient (G) at the molten silicon solid silicon interface of about $1\times10^{-5}$ cm$^2$/s·K to about $5\times10^{-5}$ cm$^2$/s·K, processing the silicon single crystal ingot into a high-resistivity wafer, and subjecting the high-resistivity wafer to an oxygen precipitation heat treatment causing the residual interstitial oxygen concentration of the wafer to become 8 ppma or less.

2. The method of claim 1, wherein the step of subjecting the high-resistivity wafer to an oxygen precipitation heat treatment causes the residual interstitial oxygen concentration in the wafer to become 6 ppma or less.

3. The method of claim 1, further comprising the step of final polishing at least one surface of the wafer after subjecting the wafer to the oxygen precipitation heat treatment.

4. The method of claim 1, wherein the oxygen precipitation heat treatment occurs between 900° C. and 1050° C.

5. The method of claim 4, further comprising the step of providing a denuded zone (DZ) on the surface of the wafer by performing a denuding heat treatment at 900° C. or higher.

6. The method of claim 1, wherein subjecting the wafer to an oxygen precipitation heat treatment comprises oxygen precipitation heat treating the wafer until the wafer has a bulk defect density of $1\times10^8$ to $2\times10^{10}$ defects/cm$^3$.

7. The method of claim 1, wherein the high-resistivity wafer has an upper surface and a lower surface, and further comprising bonding a second silicon wafer to the upper surface of the high-resistivity wafer to form a single silicon on insulation (SOI) wafer.

8. The method of claim 7, wherein the high-resistivity wafer and the second silicon wafer are bonded by a thin oxide film disposed between the wafers.

9. The method of claim 1, wherein the high-resistivity wafer has opposed first and second surfaces, and further comprising the step of depositing an epitaxial layer upon the first surface of the high-resistivity wafer.

10. The method of claim 1, wherein the ratio v/G is between about $1.6\times10^{-5}$ cm$^2$/s·K to about $4.2\times10^{-5}$ cm$^2$/s·K.

11. The method of claim 1, wherein the ratio v/G is between about $2.1\times10^{-5}$ cm$^2$/s·K to about $2.3\times10^{-5}$ cm$^2$/s·K.

12. The method of claim 1, wherein the pull rate varies during growth of the silicon ingot.

13. The method of claim 1, wherein the axial temperature gradient (G) at the molten silicon solid silicon interface is varied during growth of the silicon ingot.

14. The method of claim 1, wherein the step of growing a silicon ingot comprises growing a crystal ingot having a resistivity of 1000 Ω·cm or greater.

15. The method of claim 1, wherein the step of growing a silicon ingot comprises growing a crystal ingot having an initial interstitial oxygen concentration of about 10 to about 25 ppma.

16. A method for producing a silicon wafer which retains high-resistivity throughout a device heat treatment, comprising:

growing a silicon single crystal ingot having a resistivity of 100 Ω·cm or more and an initial interstitial oxygen concentration of 10 to 40 ppma by the Czochralski method with a ratio of pull rate (v) to axial temperature gradient (G) at the molten silicon solid silicon interface of about $1\times10^{-5}$ cm$^2$/s·K to about $5\times10^{-5}$ cm$^2$/s·K processing the silicon single crystal ingot into a high-resistivity wafer opposed first and second surfaces, subjecting the high-resistivity wafer to an initial oxygen precipitation heat treatment, contacting a second silicon wafer to the first surface of the high-resistivity wafer via a thin oxide film, and subjecting the wafers to a final oxygen precipitation heat treatment, thereby reducing the residual interstitial oxygen concentration in the high-resistivity wafer to 8 ppma or less, and bonding the high-resistivity wafer and second wafer to form a single silicon on insulation (SOI) wafer.

* * * * *